United States Patent
Chang

(10) Patent No.: US 7,573,071 B2
(45) Date of Patent: Aug. 11, 2009

(54) LIGHT EMITTING DIODE PACKAGE

(75) Inventor: Hsi-Sheng Chang, Hsinchu (TW)

(73) Assignee: Young Lighting Technology Corporation, Hsin-Chu (TW)

( * ) Notice: Subject to any disclaimer, the term of this patent is extended or adjusted under 35 U.S.C. 154(b) by 0 days.

(21) Appl. No.: 11/850,037

(22) Filed: Sep. 5, 2007

(65) Prior Publication Data

US 2008/0179620 A1 Jul. 31, 2008

(30) Foreign Application Priority Data

Jan. 31, 2007 (TW) .............................. 96103497 A

(51) Int. Cl.
*H01L 33/00* (2006.01)
(52) U.S. Cl. ........................................ 257/81; 257/787
(58) Field of Classification Search ................ 257/712, 257/714, 718, 13, 79, 81, 787
See application file for complete search history.

(56) References Cited

U.S. PATENT DOCUMENTS 6,274,924 B1 8/2001 Carey et al.
6,590,235 B2 7/2003 Carey et al.
7,264,378 B2 * 9/2007 Loh ........................... 362/294

* cited by examiner

*Primary Examiner*—Roy K Potter
(74) *Attorney, Agent, or Firm*—Jianq Chyun IP Office

(57) ABSTRACT

A light emitting diode (LED) package including a carrier, an LED chip, a first transparent encapsulant, a transparent cap, and a second transparent encapsulant is provided. The carrier has a carrying surface and a ring frame disposed on the carrying surface, and the ring frame forms an encapsulant-containing space on the carrying surface. The LED chip is disposed on the carrying surface and in the encapsulant-containing space. The LED chip is electrically connected to the carrier. The first transparent encapsulant fills the encapsulant-containing space to encapsulate the LED chip. The transparent cap is disposed on the carrier to cover the first transparent encapsulant and the ring frame. The second transparent encapsulant fills an interval between the first transparent encapsulant and the transparent cap.

2 Claims, 5 Drawing Sheets

US 7,573,071 B2

LIGHT EMITTING DIODE PACKAGE

CROSS-REFERENCE TO RELATED APPLICATION

This application claims the priority benefit of Taiwan application serial no. 96103497, filed Jan. 31, 2007. All disclosure of the Taiwan application is incorporated herein by reference.

BACKGROUND OF THE INVENTION

1. Field of the Invention

The present invention relates to a chip package, and more particularly to a light emitting diode (LED) package.

2. Description of Related Art

Due to numerous advantages of long life span, miniature size, high vibration and shock resistance, low heat generating, low power consumption and so on, light emitting diodes (LEDs) have been widely applied to indicating lights or light sources employed in a variety of household electric appliances and instruments. With recent development towards multicolor and high illumination, the applications of the LEDs are extended to large-sized outdoor billboards, traffic lights, etc. In the future, the LEDs may become the power-saving and environment-friendly light sources in replacement of tungsten lamps and mercury vapor lamps.

Please refer to FIG. 1. A conventional LED package 100 includes a lead frame 110, an LED chip 120, a transparent encapsulant 130, a transparent cap 140, and two bonding wires 150.

The lead frame 110 includes an electrically isolated body 112, two leads 114 and a heat sink 116. The electrically isolated body 112 encapsulates a part of the heat sink 116 and a part of each of the leads 114. The LED chip 120 is disposed on the heat sink 116 and is electrically connected to the two leads 114 through the two bonding wires 150. The electrically isolated body 112 includes a trench 112a exposing a part of each of the leads 114 and the two bonding wires 150, and the trench 112a leads to an easy assembling of the transparent cap 140 with the electrically isolated body 112. The transparent encapsulant 130 is positioned between the transparent cap 140 and the lead frame 110 to encapsulate and protect the LED chip 120 and the two bonding wires 150.

According to the related art, the transparent cap 140 is firstly formed and then assembled and mounted to the electrically isolated body 112. During assembling, a vacuum process performed between the transparent cap 140 and the lead frame 110 is required, such that the transparent encapsulant 130 is injected. However, said vacuum process does not result in a perfect vacuum between the transparent cap 140 and the leadframe 110, and thus some air still remains in the transparent encapsulant 130, which adversely affects the optical performance of the LED package 100.

To overcome the aforesaid drawbacks, in another conventional LED package, the transparent encapsulant is formed on the leadframe through directly performing an injection molding process in absence of disposing the transparent cap. Nevertheless, due to the small size of the LED package, a nozzle required in the injection molding process is not apt to be disposed. Moreover, given that the material of the transparent encapsulant is silica gel, the transparent encapsulant should be formed through a thermal curing process instead of the injection molding process.

SUMMARY OF THE INVENTION

It is an object of this invention to provide an LED package with less air remaining in two transparent encapsulants.

It is another object of this invention to manufacture an LED package. Through said manufacturing method, two transparent encapsulants are respectively formed in two steps to reduce the air remaining therein.

Other advantages and objects of the present invention can be further comprehended through the technical features disclosed in the present invention.

In order to achieve the aforementioned and other advantages, the present invention provides an LED package including a carrier, an LED chip, a first transparent encapsulant, a transparent cap, and a second transparent encapsulant. The carrier has a carrying surface and a ring frame disposed on the carrying surface. The ring frame forms an encapsulant-containing space on the carrying surface. The LED chip is disposed on the carrying surface and in the encapsulant-containing space, and the LED chip is electrically connected to the carrier. The first transparent encapsulant fills the encapsulant-containing space and encapsulates the LED chip. The transparent cap is disposed on the carrier and covers the first transparent encapsulant and the ring frame. The second transparent encapsulant fills an interval between the first transparent encapsulant and the transparent cap.

In order to achieve the aforementioned and other advantages, the present invention further provides a manufacturing method of an LED package. The method includes the following steps. First, a carrier having a carrying surface and a ring frame disposed on the carrying surface is provided. The ring frame forms an encapsulant-containing space on the carrying surface. An LED chip is then disposed on the carrying surface and in the encapsulant-containing space. Next, the LED chip is electrically connected to the carrier. Thereafter, the encapsulant-containing space is filled with a first transparent encapsulant, such that the first encapsulant encapsulates the LED chip. After that, the first transparent encapsulant is cured. Afterwards, a second transparent encapsulant is formed on the first transparent encapsulant. Finally, a transparent cap is pressed on the second transparent encapsulant and bonded to the carrier, such that the transparent cap covers the first transparent encapsulant and the ring frame, and that the second transparent encapsulant fills an interval between the first transparent encapsulant and the transparent cap.

In view of the foregoing, the quantity of the first transparent encapsulant filling the whole encapsulant-containing space can be controlled, for the carrier of the present invention has the ring frame. With the two-step manufacturing process provided in the present invention, the respective formations of the first transparent encapsulant and of the second transparent encapsulant result in a reduction of the air remaining in the first and the second transparent encapsulants positioned between the transparent cap and the carrier.

Other objectives, features and advantages of the present invention will be further understood from the further technology features disclosed by the embodiments of the present invention wherein there are shown and described preferred embodiments of this invention, simply by way of illustration of modes best suited to carry out the invention.

DESCRIPTION OF EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
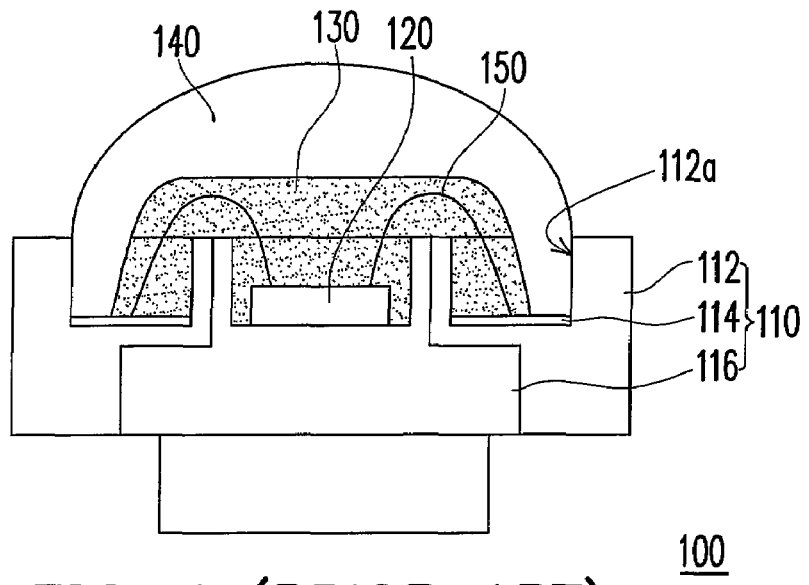
FIG. 1 is a schematic cross-sectional side view depicting a conventional LED package.
Figure 2:
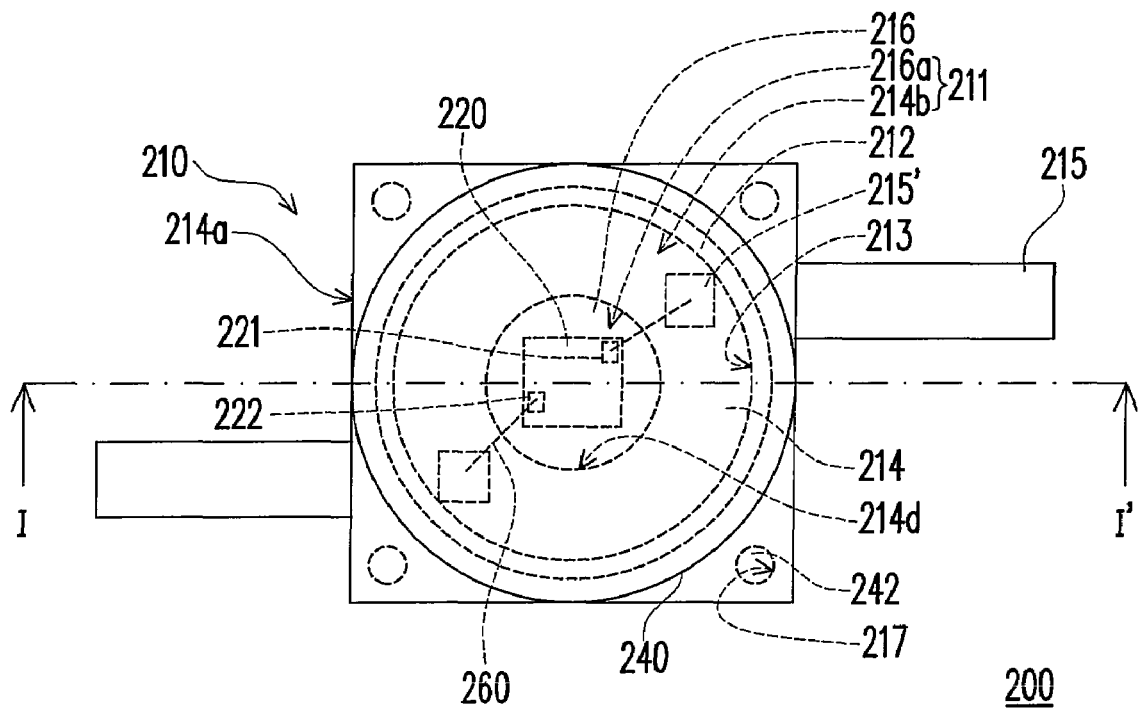
FIG. 2 is a schematic top view depicting an LED package according to one embodiment of the present invention.
Figure 3:
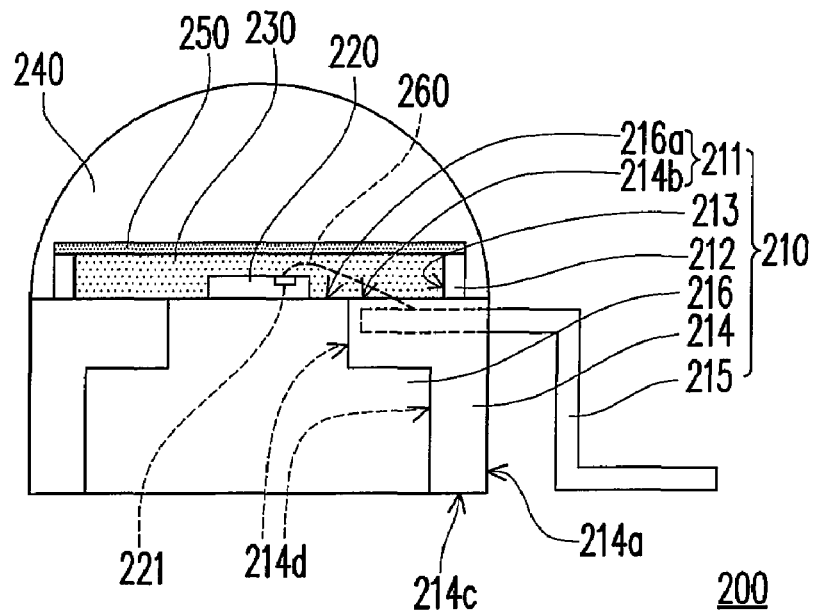
FIG. 3 is a schematic cross-sectional view depicting the LED package of FIG. 2 along line I-I'.

With reference to FIGS. 2 and 3, an LED package 200 according to one embodiment of the present invention includes a carrier 210, an LED chip 220, a first transparent encapsulant 230, a transparent cap 240, and a second transparent encapsulant 250. The carrier 210 has a carrying surface 211 and a ring frame 212 disposed on the carrying surface 211. The ring frame 212 forms an encapsulant-containing space 213 on the carrying surface 211.

The carrier 210 may be a leadframe or a circuit board having a plurality of insulating layers and a plurality of circuit layers which are alternately stacked. The leadframe is taken for an example to elaborate the present invention hereinafter. According to the present embodiment, the carrier 210 e.g. the leadframe includes an electrically isolated body 214, a plurality of leads 215, and a heat sink 216. The electrically isolated body 214 has an upper surface 214b, a lower surface 214c opposite to the upper surface 214b, and a plurality of sides 214a connecting the upper surface 214b and the lower surface 214c. The ring frame 212 is disposed on the upper surface 214b. The electrically isolated body 214 and the ring frame 212 is composed of the same material, such as liquid crystal polymer (LCP), polyphthal amide (PPA), or high temperature nylon (HTN). In addition, the electrically isolated body 214 and the ring frame 212 may be integrally formed. The electrically isolated body 214 forms an opening 214d penetrating through a portion of the upper surface 214b and the lower surface 214c.

There are two leads 215 disclosed in the present embodiment, and one end of each of the leads 215 is inserted in the electrically isolated body 214, and the other end thereof extends from one of the sides 214a of the electrically isolated body 214. Particularly, the two leads 215 are extended from the two corresponding sides 214a of the electrically isolated body 214, respectively. The upper surface 214b of the electrically isolated body 214 exposes a part 215' of each of the leads 215, and the LED chip 220 is electrically connected to the leads 215. The material of the leads 215 may be metal, and the surface of the leads 215 may be plated with the metal such as nickel (Ni), silver (Ag), aluminum (Al), platinum (Pt), palladium (Pd), gold (Au), or the like.

The heat sink 216 is disposed in the opening 214d of the electrically isolated body 214, and the upper surface 214b and the lower surface 214c of the electrically isolated body 214 expose the heat sink 216, respectively. The LED chip 220 is disposed on an upper surface 216a of the heat sink 216, and the upper surface 216a of the heat sink 216 and the upper surface 214b of the electrically isolated body 214 are on the carrying surface 211. The material of the heat sink 216 may be Ag, copper (Cu) or aluminum nitride (AlN), and the surface of the heat sink 216 may be also plated with the metal such as Ni, Ag, Al, Pt, Pd, Au, or the like. Thereby, the heat generated by the operation of the LED 220 may be directly transferred to the external environment through the heat sink 216, which effectively protects the LED chip 220 from being damaged due to overheat even though the LED chip 220 is driven by high currents. The heat sink 216 may be separated from the leads 215.

Figure 6:
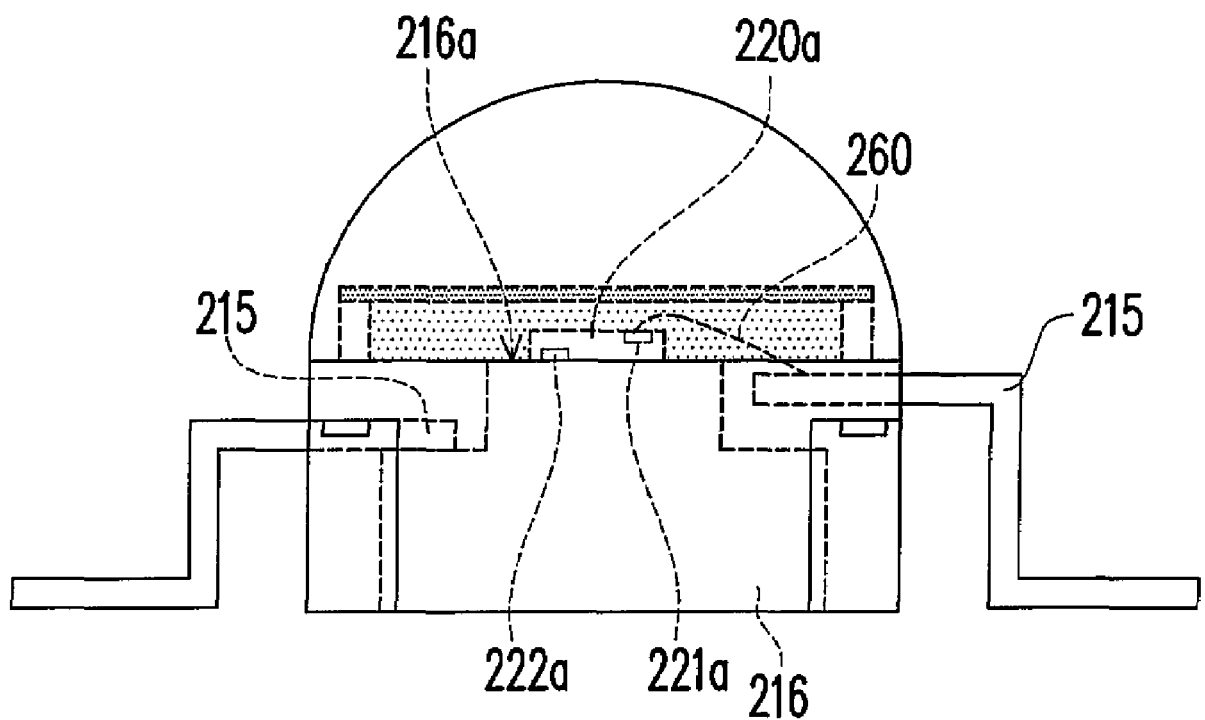
FIG. 6 is a schematic cross-sectional side view depicting an LED package having another LED chip according to the present invention.

The LED chip 220 is disposed on the carrying surface 211 and in the encapsulant-containing space 213, and the LED chip 220 is electrically connected to the carrier 210. Taking an LED chip emitting a blue or green light and having contact pads 221 and 222 both disposed on the same surface of the LED chip 220 for an example, the contact pads 221 and 222 are electrically connected to the leads 215 through a wire bonding technology. In other words, one end of each bonding wire 260 is connected to the contact pad 221 or to the contact pad 222, and the other end of each of the bonding wires 260 is connected to one of the leads 215, such that the LED chip 220 is electrically connected to the leads 215. Here, the bonding wires 260 may be Au, Al, Cu, or other suitable metal line. In addition, referring to FIG. 6, an LED chip 220 emitting a red light and having contact pads 221a and 222a respectively disposed on the corresponding surfaces of an LED chip 220a is taken for an example. The contact pad 221a is electrically connected to one of the leads 215 through one bonding wire 260, and the other contact pad 222a contacts the upper surface 216a of the heat sink 216, and the heat sink 216 is electrically connected to the other lead 215.

Please refer to FIGS. 2 and 3 again. The first transparent encapsulant 230 fills the encapsulant-containing space 213 and encapsulates the LED chip 220 and the bonding wires 260. The material of the first transparent encapsulant 230 may be epoxy encapsulant, silica gel or UV curing glue. The second transparent encapsulant 250 fills an interval between the first transparent encapsulant 230 and the transparent cap 240. The material of the second transparent encapsulant 250 may be the epoxy encapsulant, the silica gel or the UV curing glue as well. However, it should be noted that the materials of the first transparent encapsulant 230 and of the second transparent encapsulant 250 are usually equivalent but are sometimes different based on demands on assorted designs.

The transparent cap 240 is disposed on the carrying surface 211 of the carrier 210 and covers the first transparent encapsulant 230 and the ring frame 212. The transparent cap 240 may be a lens, and the material thereof may include polycarbonate (PC), polymethyl methacrylate (PMMA), the silica gel, the epoxy encapsulant or the like. Note that the color of the transparent cap 240 employed in the present invention may be any color and may include a fluorescent powder. For example, given that the LED chip 220 is an LED chip emitting an UV light, a red, a green or a blue fluorescent powder may be included in the transparent cap 240, such that a red, a green or a blue light is then emitted by the LED package 200. Alternatively, the red, the green and the blue fluorescent powders mixed in an adequate proportion may be added into the transparent cap 240, such that the LED package 200 is capable of emitting a white light. Further, if the LED chip 220 is an LED chip emitting blue light, a yellow fluorescent powder may be included in the transparent cap 240, such that the white light is emitted by the LED package 200. It is of certainty that the colors of the lights emitted by the LED package 200 are not limited in the present invention, and the required fluorescent powders may be added to the transparent cap 240 by the manufacturer based on the demands on the designs.

Figure 4:
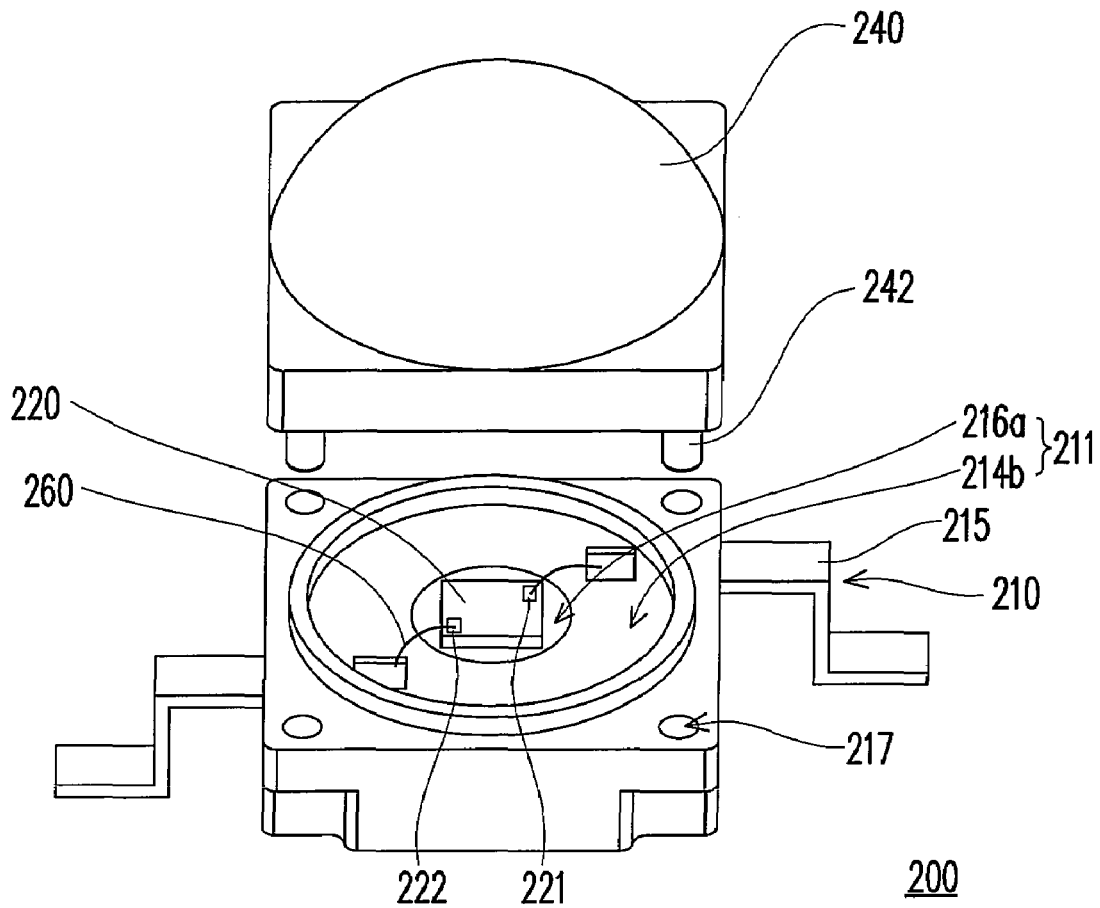
FIG. 4 is a perspective exploded scheme depicting a transparent cap and a carrier of FIG. 2.

With reference to FIG. 4, the carrier 210 may further have at least a first connecting portion 217 disposed on the carrying surface 211 (four first connecting portions respectively positioned at four corners of the carrying surface 211 are schematically depicted in FIG. 4). The transparent cap 240 may have at least a second connecting portion 242 (in the same quantity as that of the first connecting portions 217). The first connecting portions 217 and the second connecting portions 242 are suitable for interconnecting with each other. The first connecting portions 217 may be holes, and the second connecting portions 242 may be protrusions. The second connecting portions 242 are inserted into the first connecting portions 217, respectively. The first and the second connecting portions 217 and 242 are melted and connected together. Nevertheless, the second connecting portions 242 may be designed as the holes based on the demands on the designs, and the first connecting portions 217 may be also designed as the protrusions. Said designs are not illustrated in the drawings of the present invention.

Figure 5A:
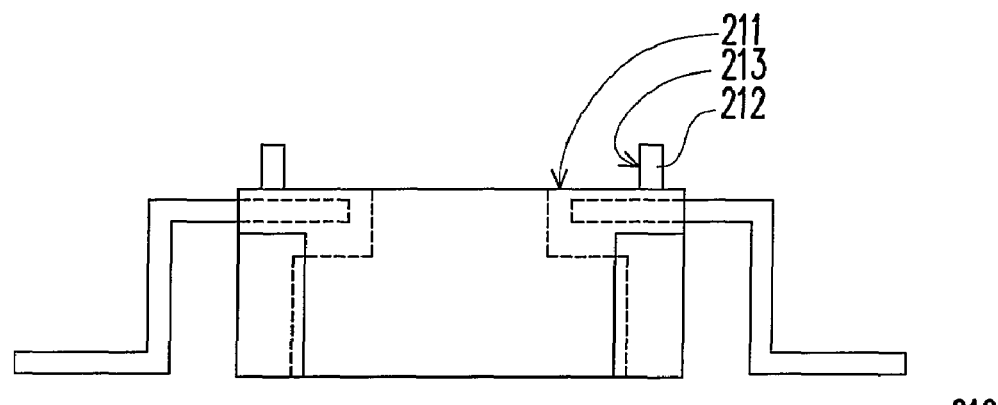
FIGS. 5A through 5E are schematic views depicting a process of manufacturing an LED package according to one embodiment of the present invention.
Figure 5B:
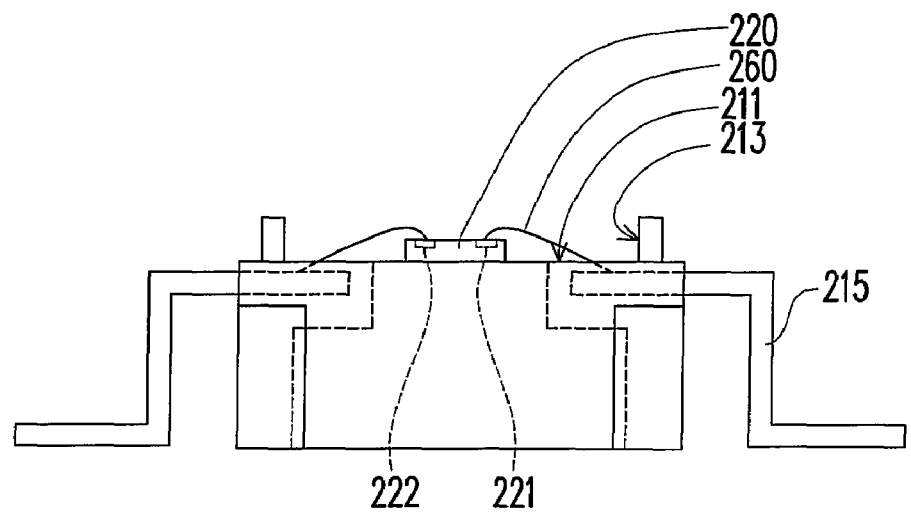

The following is a detailed description of a manufacturing method of the LED package 200. First, referring to FIG. 5A, a carrier 210 having a carrying surface 211 and a ring frame 212 disposed on the carrying surface 211 is provided. The ring frame 212 forms an encapsulant-containing space 213 on the carrying surface 211, and the carrier 210 may be the lead frame as provided hereinbefore. Next, referring to FIG. 5B, an LED chip 220 is disposed on the carrying surface 211 and in the encapsulant-containing space 213. Thereafter, the LED chip 220 may be electrically connected to the carrier 210 through a wire bonding technology. According to the present embodiment, the LED chip 220 may be electrically connected to two leads 215 through two respective bonding wires 260.

Figure 5C:
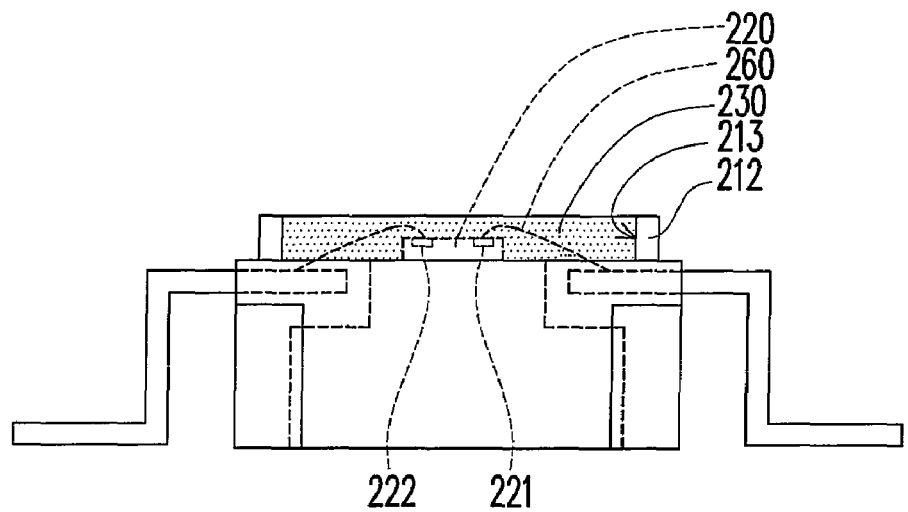
Figure 5D:
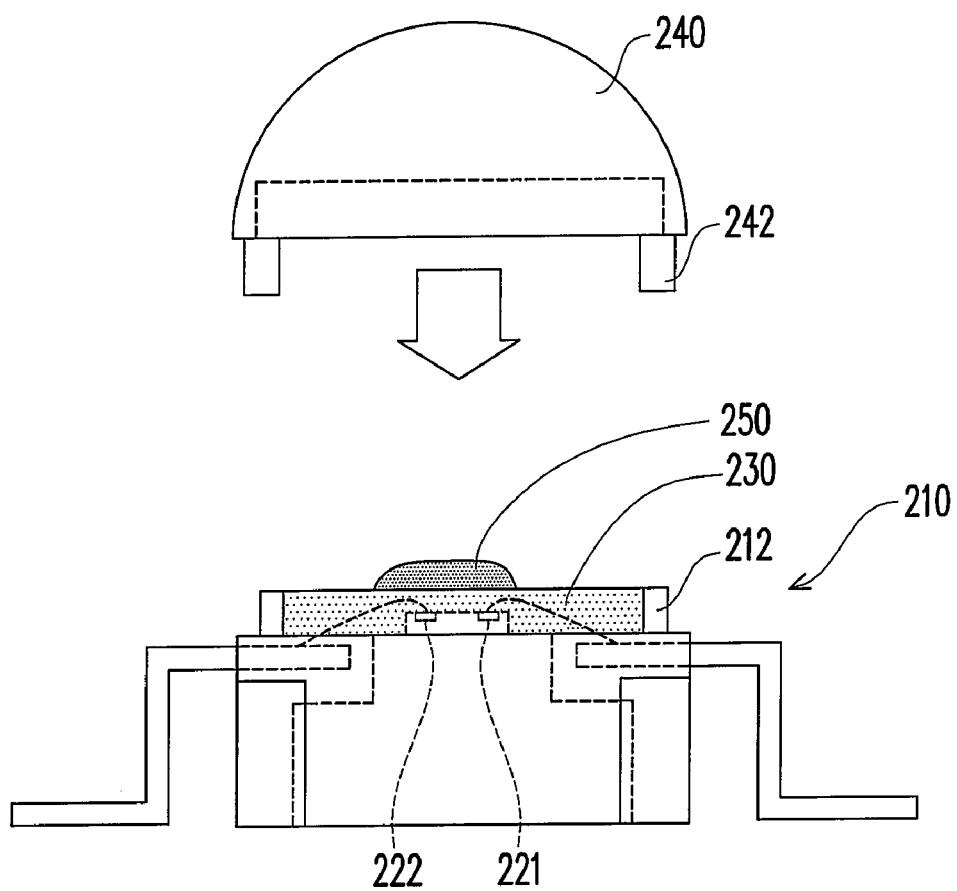

After that, referring to FIG. 5C, the encapsulant-containing space 213 may be filled with a first transparent encapsulant 230, such that the first encapsulant 230 encapsulates the LED chip 220 and the bonding wires 260 through a glue dispensing method. The quantity of the first transparent encapsulant 230 filling the whole encapsulant-containing space 213 can be controlled, for the carrier 210 has the ring frame 212. Thereby, the air barely remains in the first transparent encapsulant 230. Afterwards, the first transparent encapsulant 230 may be cured through heating the first transparent encapsulant 230 or irradiating the first transparent encapsulant 230 with the UV light. Then, as shown in FIG. 5D, a second transparent encapsulant 250 may be formed on the first transparent encapsulant 230 through the glue dispensing method. Here, the second transparent encapsulant 250 is still a fluid.

Figure 5E:
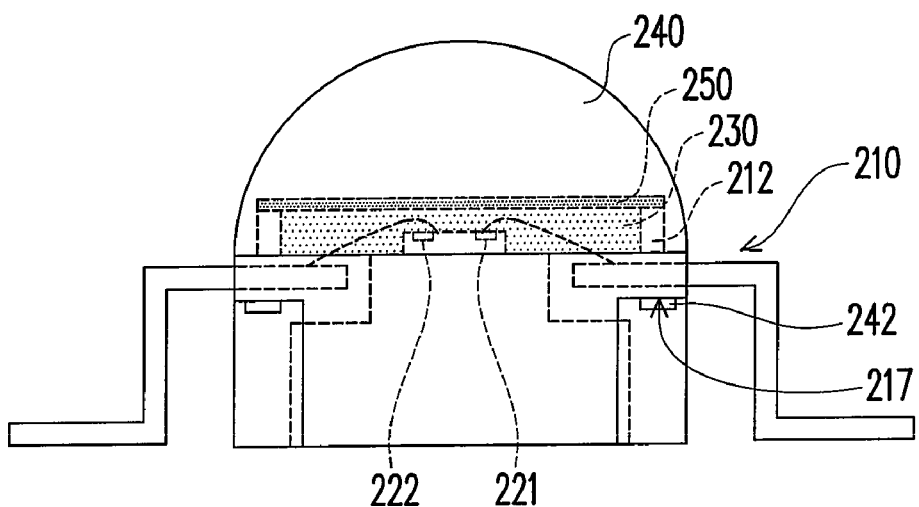

Next, referring to FIGS. 5D and 5E, a transparent cap 240 is pressed on the second transparent encapsulant 250 and bonded to the carrier 210, such that the transparent cap 240 covers the first transparent encapsulant 230 and the ring frame 212, and that the second transparent encapsulant 250 fills an interval between the first transparent encapsulant 230 and the transparent cap 240. It should be noted that the pressed second transparent encapsulant 250 is capable of squeezing out the air remaining between the transparent cap 240 and the first transparent encapsulant 230 during the process of pressing the transparent cap 240 on the second transparent encapsulant 250, for the interval between the transparent cap 240 and the first transparent encapsulant 230 is quite narrow and small. Moreover, the carrier 210 has a plurality of first connecting portions 217, and the transparent cap 240 has a plurality of second connecting portions 242. Hence, the method of bonding the transparent cap 240 to the carrier 210 includes positioning, melting and connecting the first connecting portions 217 and the second connecting portions 242. Afterwards, the second transparent encapsulant 250 may be cured through heating the second transparent encapsulant 250 or irradiating the second transparent encapsulant 250 with the UV light.

To sum up, the quantity of the first transparent encapsulant filling the whole encapsulant-containing space can be controlled, for the carrier of the present invention has the ring frame. With the two-step manufacturing process provided in the present invention, the respective formations of the first transparent encapsulant and of the second transparent encapsulant result in a reduction of the air remaining in the first and the second transparent encapsulants positioned between the transparent cap and the carrier. Besides, machine equipments for performing a vacuum process are not required in the two-step manufacturing process of forming the first transparent encapsulant and the second transparent encapsulant according to the present invention. Accordingly, the manufacturing costs can be reduced, and an air flush-back phenomenon arisen from the difference between the internal pressure and the external pressure during the vacuum process can be also prevented.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting diode package, comprising:
    a carrier having:
        a carrying surface;
        a ring frame disposed on the carrying surface, wherein the ring frame forms an encapsulant-containing space on the carrying surface; and
        at least a first connecting portion;
    a light emitting diode chip disposed in the encapsulant-containing space on the carrying surface, wherein the light emitting diode chip is electrically connected to the carrier;
    a first transparent encapsulant filling the encapsulant-containing space and encapsulating the light emitting diode chip;
    a transparent cap disposed on the carrier, covering the first transparent encapsulant and the ring frame, and having at least a second connecting portion, wherein the first connecting portion and the second connecting portion are interconnecting with each other; and
    a second transparent encapsulant filling an interval between the first transparent encapsulant and the transparent cap.

2. The light emitting diode package of claim 1, wherein the carrier is a lead frame and comprises:
    an electrically isolated body having an upper surface, a lower surface opposite to the upper surface, and a side connecting the upper surface and the lower surface, wherein the ring frame is disposed on the upper surface, and the electrically isolated body forms an opening penetrating through the upper surface and the lower surface;
    a plurality of leads, wherein one end of each of the leads is inserted in the electrically isolated body, the other end extends from the side, the upper surface exposes a part of each of the leads, and the light emitting diode chip is electrically connected to the leads;
    a heat sink disposed in the opening of the electrically isolated body, wherein the light emitting diode chip is disposed on an upper surface of the heat sink, and the upper surface of the heat sink and the upper surface of the electrically isolated body are on the carrying surface; and
    at least a bonding wire through which at least a contact pad of the light emitting diode chip is electrically connected to the carrier.

* * * * *